United States Patent

Sone et al.

[11] Patent Number: 5,818,236
[45] Date of Patent: Oct. 6, 1998

[54] METHOD AND APPARATUS FOR CHECKING INSULATION OF UNGROUNDED POWER SOURCE

[75] Inventors: Toshihiro Sone; Hideki Inoue; Koji Sakai; Shugo Kondo, all of Saitama-ken, Japan

[73] Assignee: Honda Giken Kogyo Kabushiki Kaisha, Tokyo, Japan

[21] Appl. No.: 891,721

[22] Filed: Jul. 14, 1997

Related U.S. Application Data

[63] Continuation of Ser. No. 563,820, Nov. 28, 1995, abandoned.

[30] Foreign Application Priority Data

Dec. 12, 1994 [JP] Japan .................................. 6-332129
Oct. 3, 1995 [JP] Japan .................................. 7-278299

[51] Int. Cl.⁶ .......................... G08B 21/00; G01R 27/26
[52] U.S. Cl. ........................... 324/509; 324/510; 324/772
[58] Field of Search .................................. 324/509, 510, 324/522, 551, 541, 544, 772, 776, 548, 111

[56] References Cited

U.S. PATENT DOCUMENTS

| | | | |
|---|---|---|---|
| 3,287,635 | 11/1966 | Moole ...................................... | 324/548 |
| 3,287,636 | 11/1966 | Gagniere ................................. | 324/509 |
| 3,569,826 | 3/1971 | Burnett ..................................... | 324/510 |
| 3,895,264 | 7/1975 | Kiriloff ..................................... | 324/510 |
| 3,975,663 | 8/1976 | Moorey ..................................... | 324/510 |
| 3,978,465 | 8/1976 | Goode ....................................... | 324/510 |
| 4,562,390 | 12/1985 | Tobise ...................................... | 324/509 |
| 5,382,946 | 1/1995 | Gale . | |
| 5,446,682 | 8/1995 | Janke et al. .............................. | 324/509 |
| 5,514,964 | 5/1996 | Benesh et al. ........................... | 324/509 |

FOREIGN PATENT DOCUMENTS

| | | | |
|---|---|---|---|
| 1763202 | 7/1971 | Germany ................................ | 324/509 |
| 0808999 | 2/1981 | U.S.S.R. ................................. | 324/509 |
| 0928254 | 5/1982 | U.S.S.R. ................................. | 324/509 |
| 1705776 | 1/1992 | U.S.S.R. ................................. | 324/509 |

*Primary Examiner*—Maura K. Regan
*Attorney, Agent, or Firm*—Nikaido, Marmelstein, Murray & Oram LLP

[57] ABSTRACT

An apparatus includes an insulated first switching element and a capacitor which are connected in series between one of positive and negative main circuit wirings connected to an ungrounded power source and a ground potential section (vehicle body); a second switching element with one terminal thereof connected to a junction point of the first switching element and the capacitor; switching element control device for selectively closing the first switching element for a predetermined time so as to charge the capacitor and for closing the second switching element so as to discharge the capacitor while the first switching element is opened; device for detecting the electric charge accumulated in the capacitor; and device for determining the insulation between the other of main circuit wirings and the ground potential section in accordance with the detected amount of charge.

21 Claims, 9 Drawing Sheets

FIG. 2
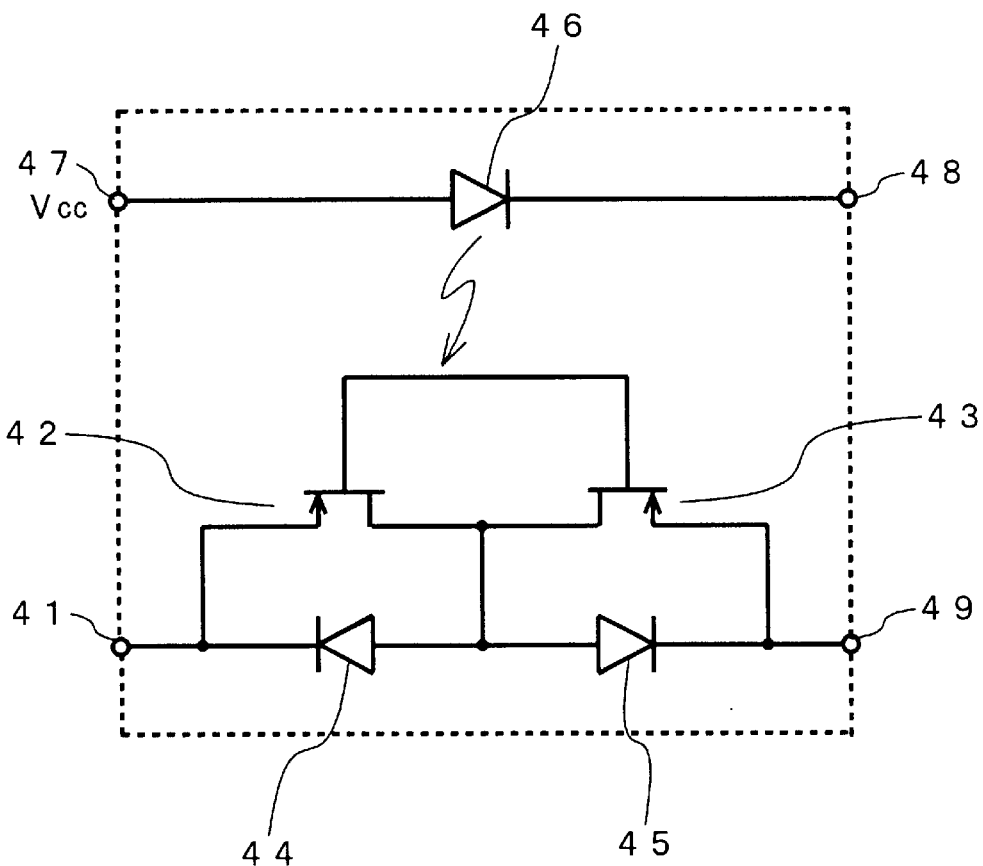
FIG. 3(a)
FIG. 3(b)
FIG. 3(c)
FIG. 3(d)

FIG. 4
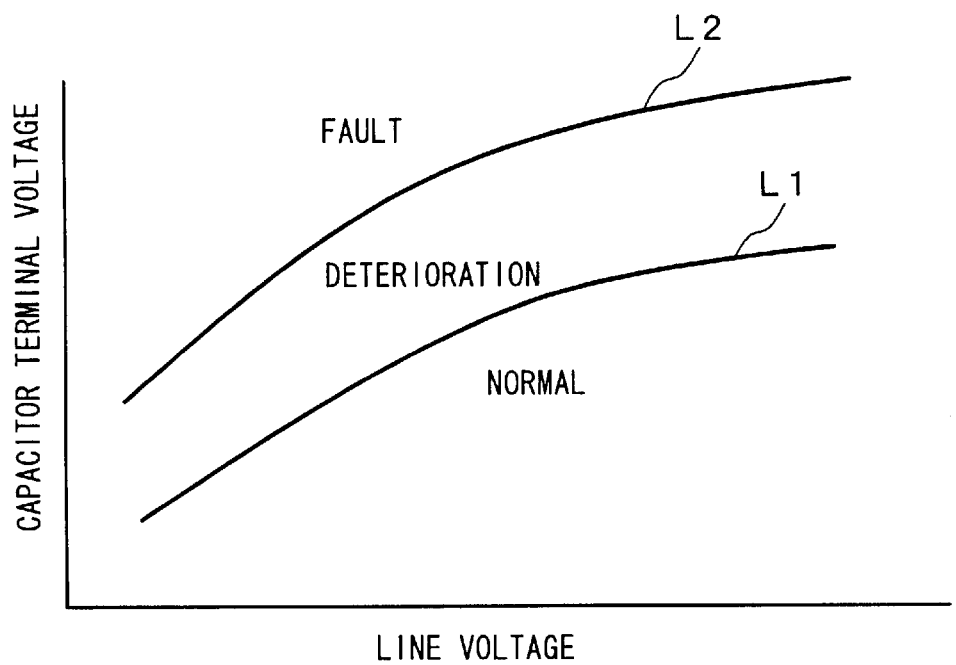
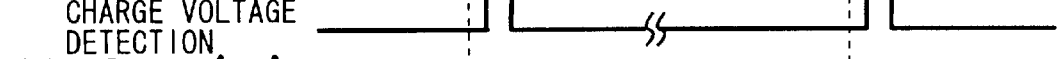

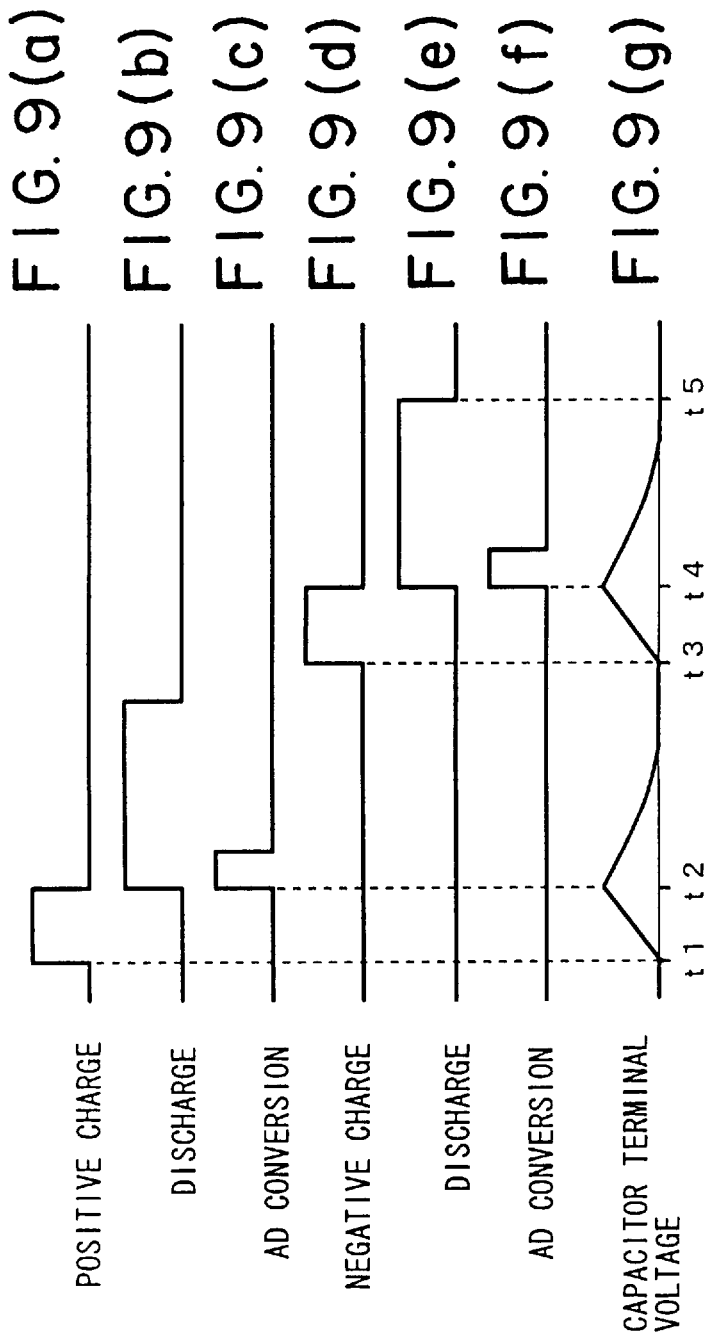

F I G. 10A
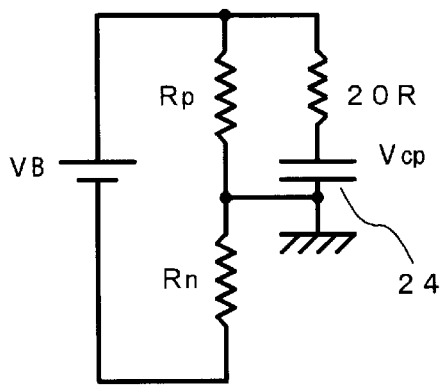
F I G. 10B
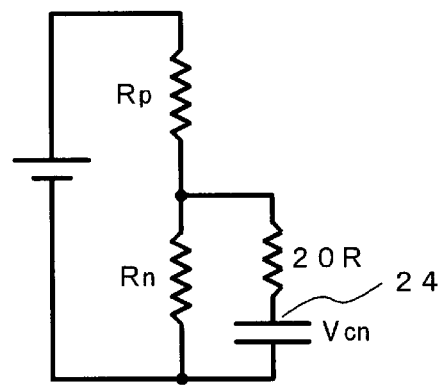
F I G. 11A
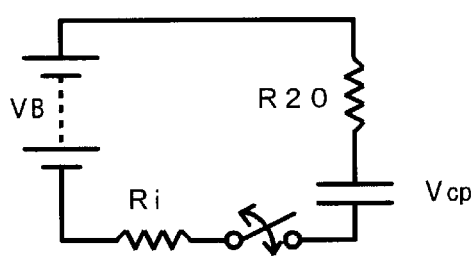
F I G. 11B
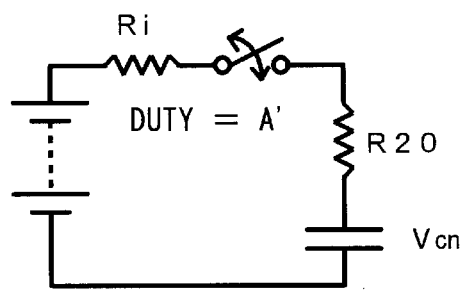

METHOD AND APPARATUS FOR CHECKING INSULATION OF UNGROUNDED POWER SOURCE

This application is a continuation of application Ser. No. 08/563,820 filed Nov. 28, 1995, now abandoned.

BACKGROUND OF THE INVENTION

1. Field of the Invention

The present invention relates to a method and an apparatus for monitoring the grounding or insulation of an ungrounded power source with respect to a ground potential section and, more particularly, the present invention relates to a method and apparatus for checking the grounding or insulation of an ungrounded DC power source and the wiring thereof, which are insulated from a vehicle body, with respect to the vehicle body in an electrical propulsion vehicle or electric vehicle.

2. Description of the Related Art

There have been demands for developing an electric vehicle which uses electric power as the propulsion energy in order to promote improvement in air pollution and environmental preservation. For this purpose, an attempt has been made to achieve a high voltage (e.g. 200 volts or more) by connecting many battery units in series so as to obtain required electric power from smallest possible current. In such a case, the power source is usually insulated from a vehicle body to make it an ungrounded power source.

As an apparatus for detecting deteriorated insulation or grounding of the ungrounded power source with respect to a ground potential section, i.e. the vehicle body, a current-operated ground leakage detector which has the positive and negative main circuit wirings on the primary of a current transformer has been known. As long as the positive and negative main circuit wirings stay normal with no deteriorated insulation or grounding, the value of the current flowing through the positive main circuit wiring is equal to that flowing through the negative main circuit wiring; therefore, no output is generated at the secondary of the current transformer. If, however, either wiring incurs grounding or an insulation failure, the currents flowing through the two main wirings become unbalanced, causing an output to be given at the secondary of the current transformer. This permits the detection of grounding or insulation failures.

A voltage-operated ground leakage detector has been also known as another apparatus for detecting deteriorated insulation or grounding in a power source. In this type of detector, the middle potential point of the power source is connected (grounded) to a vehicle body via a high grounding resistor so that the high grounding resistance and the grounding resistance owing to deteriorated insulation or grounding are connected in series, thus determining the degree of the deterioration in insulation or grounding by monitoring the voltages between the vehicle body and the positive and negative terminals of the power source.

When the current-operated ground leakage detector is applied to such an ungrounded power source as mentioned above, however, a problem is posed: if an insulation failure or grounding takes place in one of the positive and negative wirings, no current path is established and therefore, no imbalance is produced between the currents through the positive wiring and the negative wiring, thus preventing the detection of the insulation failure or grounding. On the other hand, the voltage operated ground leakage detector inherently requires high grounding resistance and therefore its use especially for the ungrounded power source for an electric vehicle is prohibited by a law or regulation (SAEJ 227a CFR Part 475.10).

SUMMARY OF THE INVENTION

It is an object of the present invention to provide a method and an apparatus for checking the insulation of an ungrounded power source for determining the insulation and grounding between a ground potential section (vehicle body) and each of a positive and a negative wirings while keeping said wirings in an ungrounded state.

The present invention is characterized in that it detects a capacitor terminal voltage generated when a series circuit composed of a current limiter and a capacitor is connected for a predetermined time between one of the positive and negative main circuit wirings, which are respectively connected to the positive and negative terminals of a DC power source and are insulated from a ground potential section, and the ground potential section; and calculates the insulation resistance between the other of the positive and negative main circuit wirings and the ground potential section in accordance with the detected terminal voltage and the output voltage of the DC power source, thereby checking the insulation of the positive and negative main circuits with respect to the ground potential section.

The present invention comprises first and second switching means for selectively connecting in series for a predetermined time a current limiter and a capacitor between the positive terminal of the main circuit wiring of the ungrounded power source and the ground potential section and/or between the negative terminal of the main circuit wiring and the ground potential section; electric charge amount detecting means for detecting the amount of the electric charge accumulated in the capacitor due to the series connection; and determination means for determining the insulation between at least either the positive or negative terminal of the main circuit wiring and the ground potential section on the basis of the detected amount of the electric charge.

An apparatus in accordance with the present invention comprises an insulated first switching device and a capacitor connected in series between at least one of a positive and a negative main circuit wirings, which are connected to an ungrounded power source, and a ground potential section; a second switching device having one terminal thereof connected to a junction point of the first switching device and the capacitor; switching device control means for charging the capacitor by selectively turning the first switching device ON for a predetermined time and turning OFF the second switching device while the first switching device is ON whereas turning the second switching device ON while the first switching device is OFF; means which is connected to the other terminal of the second switching device and which detects the amount of the electric charge charged in the capacitor; and determination means for determining the insulation between at least the other main circuit wiring and the ground potential section on the basis of the detected amount of the electric charge.

The present invention may further comprise, as necessary, a current limiter (e.g. a fixed resistor, the resistance value of which is already known) connected in series in the capacitor charging circuit which is formed when the first switch is turned ON or closed and a voltage detector circuit for detecting the voltage across the positive and negative main circuit wirings. It is desirable that the determination means is provided in advance with a table showing the relationship between the amount of the electric charge accumulated in the capacitor, the voltage across the positive and negative main circuit wirings and the insulation between the positive or negative main circuit wiring and the ground potential section. Using the fixed resistor, the resistance value of which is already known, as the current limiter makes it possible to determine the grounding resistance value by calculation, thus permitting accurate determination of the insulation even if both of the positive and negative terminals of the main power source incur grounding or if intermittent grounding such as one taking place in an inverter for driving a propulsion motor occurs.

BRIEF DESCRIPTION OF THE DRAWINGS

FIG. 2 is a circuit diagram showing a specific example of an insulated switch suited for the present invention;

FIG. 3 is a time chart for illustrating the operation of the first embodiment;

FIG. 4 is a diagram showing an example of a determination table suited for the present invention;

FIG. 6 is a time chart illustrating the operation of the second embodiment;

FIG. 9 is a time chart illustrating the operation of the third embodiment;

FIG. 10A and FIG. 10B are equivalent circuit diagrams of the capacitor charging circuit in the third embodiment;

FIG. 11A and FIG. 11B are equivalent circuit diagrams applied when grounding takes place in an inverter of the third embodiment;

DETAILED DESCRIPTION OF THE PREFERRED EMBODIMENTS

Figure 1:
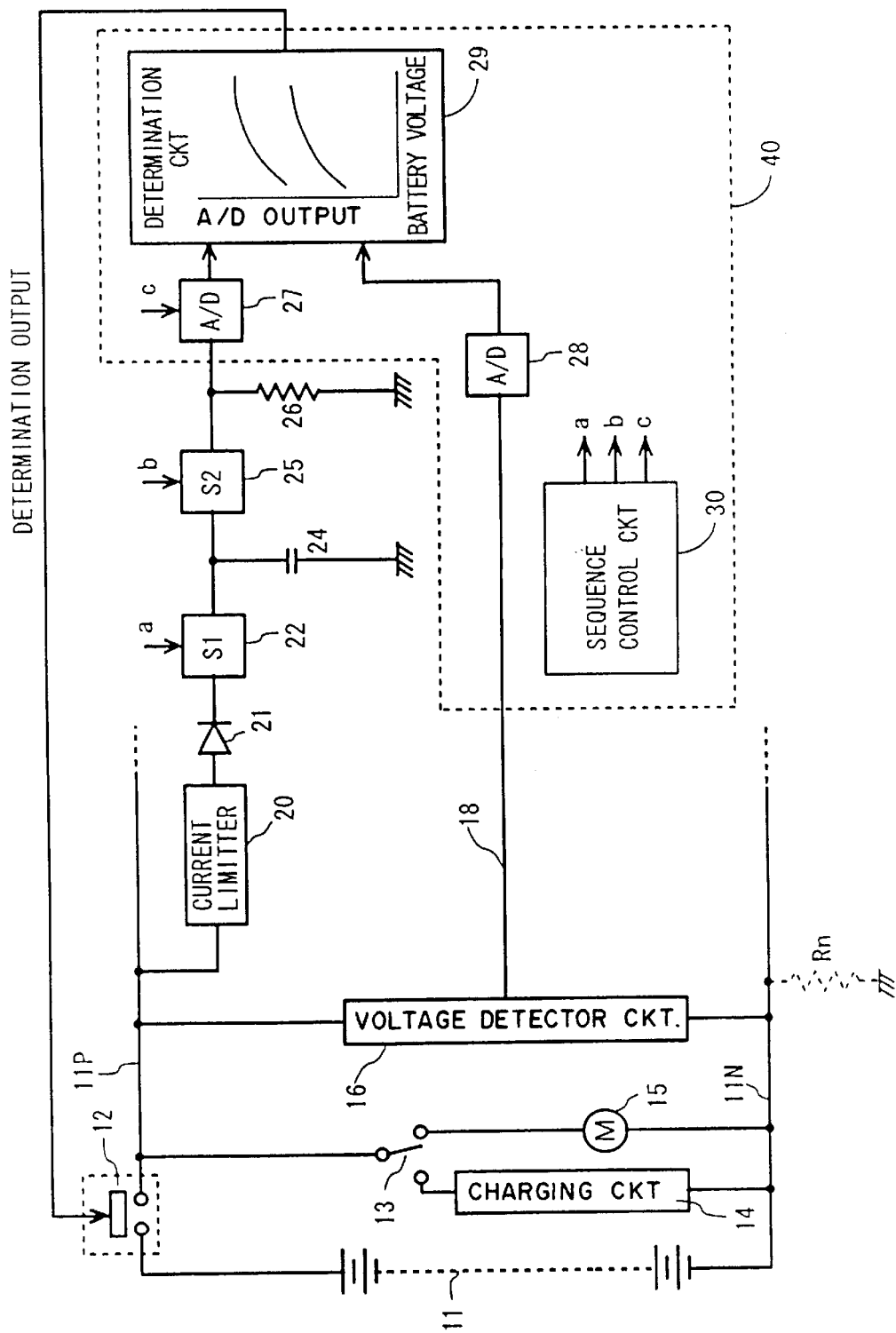
FIG. 1 is a block diagram of a first embodiment of the present invention.

FIG. 1 is a block diagram of a first embodiment according to the present invention, provided with a basic configuration of the present invention. The first embodiment may be regarded as an example where the present invention is applied to an ungrounded power source of an electric vehicle. A power source 11 includes, for example, many battery elements connected in series and it is selectively connected to a battery charging circuit 14 or a motor 15 for driving a vehicle via a breaker 12 and a selector switch 13. A voltage detector circuit 16 is connected between a positive main circuit wiring 11P and a negative main circuit wiring 11N and it generates a line voltage signal on an output line 18. The line voltage signal is supplied to one input of a determination circuit 29 via an analog-to-digital (AD) converter 28. The voltage detector circuit 16 may have the same configuration as that in a second embodiment which will be discussed later.

A current limiter 20, a diode 21, an insulated first switch 22, and a capacitor 24 are connected in series between the positive main circuit wiring 11P and the ground (vehicle body). The current limiter 20 may be a resistor and/or an inductor. The junction node of the first switch 22 and the capacitor 24 is connected to the other input of the determination circuit 29 via an insulated second switch 25 and an AD converter 27. The junction node of the second switch 25 and the AD converter 27 is grounded via a resistor 26. A determination table (see FIG. 4) for issuing a signal, which indicates the insulation state on the basis of outputs of the AD converters 27 and 28 as parameters, is stored in the determination circuit 29; the breaker 12 is opened or closed in accordance with the determination output. A sequence control circuit 30 controls the opening and closing of the switches 22 and 25 in accordance with the predetermined time relation which will be described later. The determination circuit 29 and the sequence control circuit 30 (and the AD converters 27 and 28 if desired) can be, of course, configured into a control circuit 40 using a microprocessor.

FIG. 2 is the circuit diagram showing the specific example of the insulated switch shown in FIG. 1. A pair of photo transistors (photo FETs in the diagram) 42 and 43 are connected in series with reverse polarity between a pair of electric wiring terminals 41 and 49; and diodes 44 and 45 are connected in parallel with reverse polarity to the respective photo transistors. A light emitting diode 46 is located in a relative position so that it is electrically isolated from the elements mentioned above while optically coupled to the photo transistors; it is connected between a pair of driving terminals 47 and 48. When driving current is supplied through the driving terminals 47 and 48, the light emitting diode 46 emits light, causing the photo transistors 42 and 43 to be turned ON, thereby allowing the pair of electric wiring terminals 41 and 49 to be electrically conductive. This means that the switch is closed. The moment the driving current is cut off, the light emitted by the light emitting diode 46 is accordingly extinguished, and causing the switch to be opened. The example shown in the drawing is a photo-coupler insulated switch, which can be applied also to alternating current; it is easily seen, only the right or left half of the construction is enough for the one exclusively designed for DC use.

FIG. 3 is the time chart for describing the operation of the first embodiment. When control signal "a" from the sequence control circuit 30 rises up at time t1, switch S1 is closed for a predetermined time which is shorter than the charging time constant of the capacitor 24. If an insulation failure with respect to the vehicle body develops in the negative main circuit wiring 11N at this time, resulting in the grounding with a resistor Rn indicated by the dotted line, then short-circuit current flows through a detecting circuit constituted by the positive wiring 11P, the current limiter 20, the diode 21, the first switch S1, the capacitor 24, the ground (vehicle body), the ground resistor Rn, and the negative wiring 11N, thus charging the capacitor 24. The time-dependent change in the electric charge accumulated in or the charging voltage of the capacitor at that time is a function of the magnitude of the grounding resistor Rn. The signal "a" is eliminated at time t2 at which the predetermined time has elapsed, then signal "b" is started up and signal "c" is also started up almost at the same time. This means that the first switch S1 is opened, then a second switch S2 is closed and the AD converter 27 is actuated in FIG. 1. Thus the capacitor 24 is isolated from the main circuit wiring 11P, then the capacitor 24 is discharged via the second switch S2 and the resistor 26. At this time, a voltage drop representing the electric charge accumulated in the capacitor 24 is generated across the resistor 26. The AD converter 27 holds a peak voltage value immediately after the start of the discharge or a voltage across the resistor 26 after the predetermined time has elapsed, and then converts it into a digital value which is supplied to the determination circuit 29.

As it may be obvious, the resistance value of the ground resistor Rn is infinite as long as the insulation stays intact and no current is allowed to flow through the detecting circuit; therefore, the charging voltage of the capacitor 24 is maintained at zero regardless of the line voltage. As the insulation deteriorates, the value of the ground resistor Rn decreases with a consequent increase in the current flowing through the detecting circuit, causing the charging voltage of the capacitor 24 to increase after the capacitor 24 has been charged for the predetermined time. This makes it possible to determine the magnitude of the grounding resistor Rn on the basis of the terminal voltage of the capacitor 24, i.e. the output of the AD converter 27, thereby enabling the insulation of the main circuit wiring to be monitored.

The charging current of the capacitor, i.e. the output of the AD converter 27 naturally depends on the voltage of the DC power source 11; therefore, considerations should be given to the line voltage for ensuring accurate determination of the insulation. For this reason, in the case of the embodiment shown in FIG. 1, the grounding resistor Rn or the insulation state of the negative wiring 11N is represented as illustrated, for example, in FIG. 4 in terms of the function of the terminal voltage of the capacitor 24, i.e. the output of the AD converter 27, and the line voltage, i.e. the output of the AD converter 28. The determination circuit 29 reads the digital value (the charging voltage of the capacitor 24) and the terminal voltage of the power source 11 at time t3 and determines the insulation state by applying these values to the determination table which has been stored in advance. The determination circuit 29 determines that the insulation is faulty if the capacitor terminal voltage is higher than curve L2; the insulation is normal if the capacitor terminal voltage is lower than curve L1; and the insulation is deteriorated although an insulation failure or fault has not yet occurred, if the capacitor terminal voltage lies between curves L1 and L2. If the determination circuit 29 decides that the insulation is not normal, then it issues an alarm or automatically triggers the breaker 12. The experiments carried out by the inventors have revealed that good detection and determination results are obtained when curves L1 and L2 are respectively assigned to ground resistances 100 KΩ and 48 KΩ for electric vehicles.

The insulation of the main circuit wiring with respect to the ground or the vehicle body can be determined by implementing the determination operation described above at an appropriate time interval, or automatically when the vehicle is in a predetermined operating state, or carried out manually at any time, with the ground potential section or the vehicle body completely isolated from a high-voltage power source. The above description refers only to the determination of the insulation of the negative wiring 11N; however, it can be easily understood that the present invention can be applied for determining the insulation of both positive and negative main circuit wirings by adding the same circuit to the negative wiring 11N, or by adding the series circuit of the current limiter and the insulation switch (and diode) between the junction point of the capacitor 24 and the switch S2 and the negative wiring 11N, or by making the current limiter 20 of FIG. 1 switchable to the negative wiring 11N by employing an insulated switch which is similar to S1 or S2.

Figure 5:
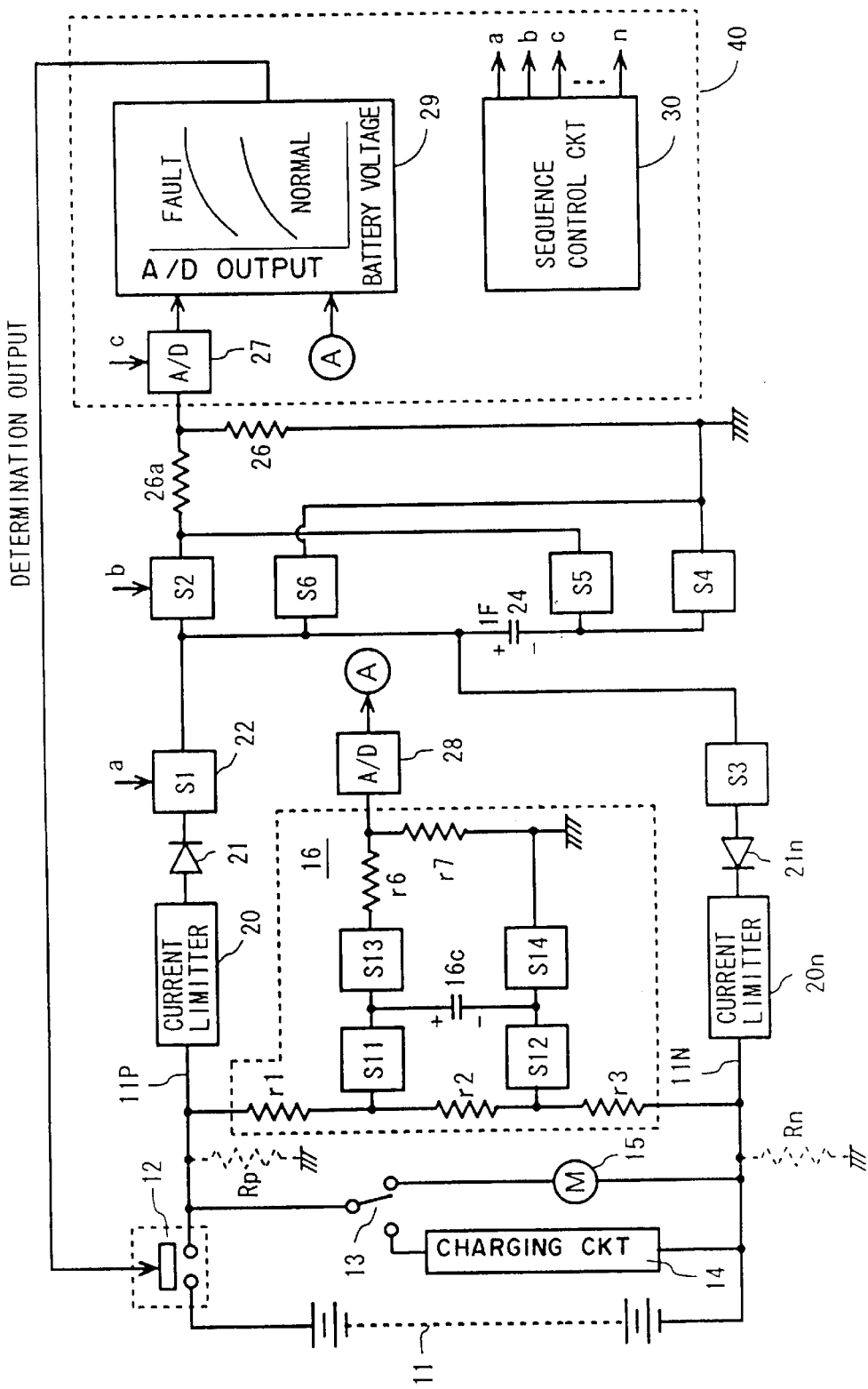
FIG. 5 is a block diagram showing a second embodiment of the present invention.

FIG. 5 is the block diagram showing the second embodiment of the present invention which enables the determination of the insulation of both positive and negative main circuit wirings. FIG. 6 is the time chart for describing the operation of the second embodiment. The same reference numerals as those used in FIG. 1 and FIG. 3 denote the same or equivalent parts. In the drawing, all switches denoted by numeral signs with "S" are the insulated switches as shown in FIG. 2. The sequence control circuit 30 in the control circuit 40 controls the respective switches described above at the expected timings which will be discussed later.

The configuration and operation of the voltage detector circuit 16 will be described first. A capacitor 16C is connected in parallel to both ends of a resistor r2, which is a part of a resistance type potential divider constructed by resistors r1, r2, and r3 connected in series between the positive and negative main circuits 11P and 11N, via the insulated switches S11 and S12, respectively. A series circuit of resistors r6 and r7 is connected in parallel also to both ends of the capacitor 16C via insulated switches S13 and S14, respectively. The junction point of the resistors r6 and r7 is connected to the input of the AD converter 28; the junction point of the resistor r7 and the switch S14 is grounded.

When the switches S11 and S12 are closed at the same time, the capacitor 16C is charged to the voltage across the resistor r2, i.e. the voltage which represents the line voltage. Then, as soon as the switches S11 and S12 have been opened, the switches S13 and S14 are closed and the capacitor 16C is discharged via the resistors r6 and r7. The AD converter 28 holds the voltage across the resistor r7 at the point immediately after the start of the discharge (or after a predetermined time has elapsed) and converts it into a digital value. As it is apparent, the digital value represents the line voltage. The output of the AD converter 28 is supplied to the determination circuit 29.

As it has already been described in relation to FIG. 1, when the switches S1 and S4 are closed, a positive wiring detector circuit, which is constituted by the positive wiring 11P, the current limiter 20, the diode 21, the first switch S1, the capacitor 24, the switch S4, the ground (vehicle body), the grounding resistor Rn, and the negative wiring 11N, is formed at the positive charge timing of FIG. 6, causing the capacitor 24 to be charged in the polarity illustrated. The electric charge or the charging voltage of the capacitor 24 is a function of the magnitude of the resistance of the grounding resistor Rn (and the line voltage) as in the case described above. In the following capacitor discharge period, the switch S1 is opened whereas the switch S2 is closed, causing the capacitor 24 to be discharged through a circuit composed of the switch S2, a resistor 26a, a resistor 26, and the switch S4. As in the first embodiment, the AD converter 27 holds the terminal voltage of the capacitor 24 or the voltage across the resistor 26 at the point immediately after the start of the discharge (or after a predetermined time has elapsed) and converts it into a digital value. Upon the completion of the discharge of the capacitor 24, the switches S2, S4 are opened. The output of the AD converter 27 is supplied to the determination circuit 29. The determination circuit 29 refers to the same table previously mentioned to determine the insulation of the negative wiring 11N. This completes the cycle of determining the insulation of the negative wiring 11N.

Then, the negative charge period for the cycle of determining the insulation of the positive wiring 11P follows, and the switches S4 and S3 are closed. This forms a negative wiring detector circuit constituted by the positive wiring 11P, a grounding resistor Rp, the ground (vehicle body), the switch S4, the capacitor 24, the switch S3, a diode 21n, a current limiter 20n, and the negative wiring 11N, causing the capacitor 24 to be charged in the reverse polarity from that shown in the drawing. The electric charge or the charging voltage of the capacitor 24 is also a function of the magnitude of the resistance of the grounding resistor Rp as in the case described above. In the following capacitor discharge period, the switches S4 and S3 are opened whereas the switches S5 and S6 are closed, thus causing the capacitor 24 to discharge through a series circuit of the switch S5, the resistor 26a, the resistor 26, (the ground), and the switch S6. The subsequent detection of the capacitor charging voltage and the determination of the insulation are the same as those of the case where the insulation of the negative wiring 11N is determined.

The embodiments described above are based on a condition where only the positive or negative wiring is grounded and the capacitor for detection is charged continuously for a predetermined time (e.g. 65 msec.) at the line voltage. Accordingly, the relationship between the battery (power supply) voltage and the detected AD output (capacitor terminal voltage) will be different from the one shown in FIG. 4, resulting in a deteriorated detection accuracy if (1) the charging voltage of the capacitor 24 is different from the line voltage as such a case where both positive and negative terminals are grounded at the same time; or (2) intermittent grounding occurs because an AC load such as a motor is connected through an inverter although only one of the positive and negative terminals is grounded.

Figure 7A:
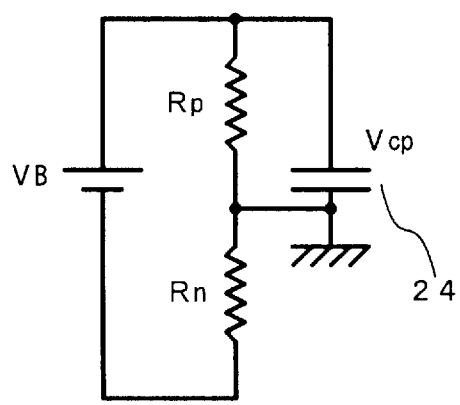
FIG. 7A and FIG. 7B are equivalent circuit diagrams applied when both of the positive and negative terminals of the main circuit are grounded at the same time.
Figure 7B:
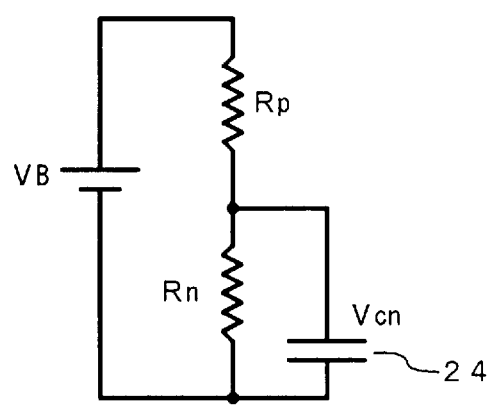

In the case of (1) above, as shown in the equivalent circuit diagrams of FIG. 7A and FIG. 7B, the capacitor 24 for detection is charged at a battery voltage which is divided by the anode grounding resistor Rp and the cathode grounding resistor Rn; therefore, the accumulated electric charge of the capacitor 24 for detection will be less even if the grounding resistance value remains unchanged. This leads to a lower output of the AD converter 27 and the detection accuracy is likely to be deteriorated, resulting in a failure of the determination of a ground fault. In the case of (2) mentioned above, the effective charging time will be shortened because the capacitor for detection is charged only intermittently, therefore, there will be less electric charge in the capacitor with a resultant deteriorated detection accuracy even when only the positive or negative terminal is grounded; a more serious detection error is likely to occur if both of the positive and negative terminals are grounded.

The third embodiment of the present invention is intended to prevent such deterioration in the detection accuracy. In this embodiment, fixed resistors are used for the current limiters 20 and 20n in the above embodiments and the grounding resistance values are calculated by the arithmetic operation described below.

Figure 8:
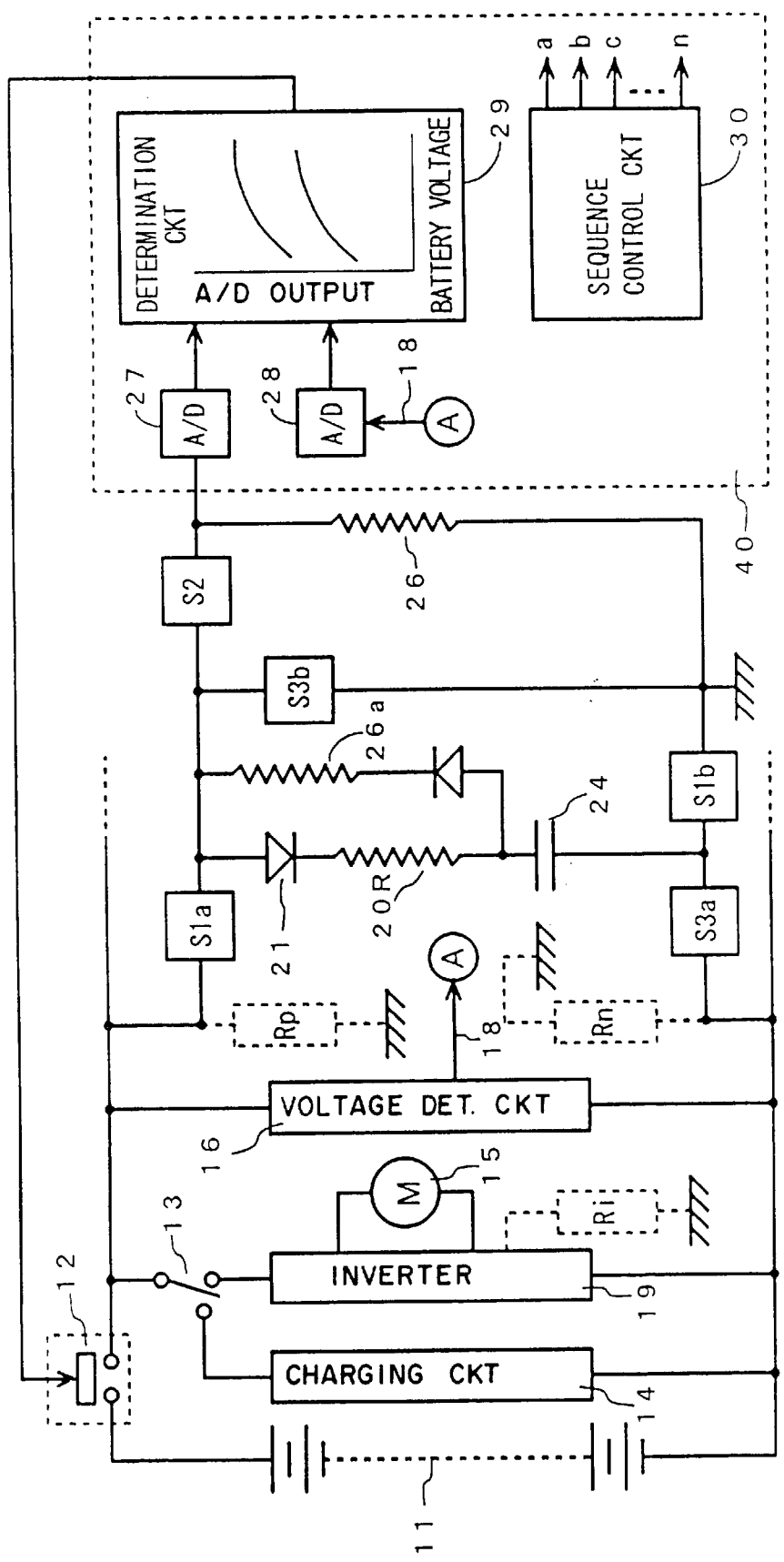
FIG. 8 is a schematic block diagram of a third embodiment.

FIG. 8 is the schematic block diagram of the third embodiment. In the drawing, the same reference numerals as those of FIG. 1 and FIG. 5 denote the same or equivalent parts. A first pair of insulated switches S1a, S1b and a second pair of switches S3a, S3b correspond respectively to the switches S1, S3 of the embodiments stated above. A fixed resistor 20R is inserted in series with the capacitor 24. The resistor 20R restricts the charging current during the determination of insulation and has a known fixed resistance value. An inverter 19 converts the DC current (e.g. 288 volts) of the power source 11 into an AC current (e.g. 200 volts) for energizing the motor 15. This embodiment requires fewer switches compared with the embodiment shown in FIG. 5.

FIG. 9 is the time chart illustrating the operation of the third embodiment. For a period from time t1 to time t2 (e.g. 65 msec.), the first pair of switches S1a and S1b are closed in response to a control signal issued from the sequence control circuit 30 whereas the switch S2 and the second pair of switches S3a and S3b are kept open. The equivalent circuit is as shown in FIG. 10A and the capacitor 24 is charged to a voltage VCp as expressed by formula 1 given below:

$$VCp = VB \cdot Q \cdot Rp/(Rp+Rn) \qquad \ldots \text{Esq. 1}$$

$$Q = 1 - e^{-W} \qquad \ldots \text{Esq. 2}$$

$$W = (Rp+Rn)T/(Rp \cdot Rn + Rn \cdot R20 + R20 \cdot Rp)C \qquad \ldots \text{Esq. 3}$$

where

T: Time of Charging

C: Capacitance of capacitor 24

At time t2, the switch S1a is opened with the switch S1b left closed and the switch S2 is closed to cause the electric charge of the capacitor 24 to be discharged via the resistors 26a and 26. The drop in the voltage across the resistor 26 caused by the discharge is detected by the AD converter 27 to be supplied to the determination circuit 29. The voltage drop represents the voltage VCp of formula 1. After the time sufficient for the capacitor 24 to fully discharge has elapsed, the switches S2 and S1b are opened, then at time t3, the second pair of switches S3a and S3b are closed for a predetermined time (e.g. 65 msec.).

The equivalent circuit is as shown in FIG. 10B and the capacitor 24 is charged to a voltage VCn as expressed by formula 4 given below:

$$VCn = VB \cdot Q \cdot Rn/(Rp+Rn) \qquad \ldots \text{Esq. 4}$$

At time t4, the switches S3a and S3b are opened and then the switches S1b and S2 are closed to cause the electric charge of the capacitor 24 to be discharged via the resistors 26a and 26. The drop in the voltage across the resistor 26 is detected by the AD converter 27 to be supplied to the determination circuit 29. The voltage drop represents the voltage VCn of formula 4. At time t5 when the time sufficient for the capacitor 24 to fully discharge has elapsed, the switches S2 and S1b are opened. This completes one measuring cycle and the circuit shown in FIG. 8 is reset.

Using VCp and VCn of formula 1 and formula 4, respectively, Rp and Rn can be determined by the following formulas 5 and 6:

$$Rp = -(VCp+VCn)G/Vcn \qquad \ldots \text{Esq. 5}$$

$$Rn = -(VCp+VCn)G/Vcp \qquad \ldots \text{Esq. 6}$$

$$G = R20 + T/C \cdot \ln\{1-(VCp+VCn)/VB\}$$

According to this embodiment, the accurate calculation of a grounding resistance value can be achieved regardless of the grounding condition of the positive and negative wirings or a change in the grounding condition, thus permitting accurate determination of insulation.

The equivalent circuits in a case where a grounding Ri occurs within the inverter 19 of FIG. 8 are shown in FIG. 11A and FIG. 11B. The charging voltage of the capacitor 24 is expressed by formulas 7 and 8 given below when the pairs of switches S1a, S1b, S3a, S3b and the switch S2 are controlled to be opened or closed in such manner as previously mentioned.

$$VCp = VB\{1 - e^{-A \cdot T/(Ri+R20)C}\} \qquad \ldots \text{Esq. 7}$$

$$VCn = VB\{1 - e^{-A' \cdot T/(Ri+R20)C}\} \qquad \ldots \text{Esq. 8}$$

where A and A' denote the switching duty ratio of the inverter 19. Based on these assumption, grounding resistance Ri is expressed by formula 9 and formula 10 below:

$$Ri = -Ri - A \cdot T/C \cdot ln\{1 - VCp/VB\} \qquad \text{... Esq. 9}$$

$$= -Ri - A' \cdot T/C \cdot ln\{1 - VCn/VB\} \qquad \text{... Esq. 10}$$

Figure 12:
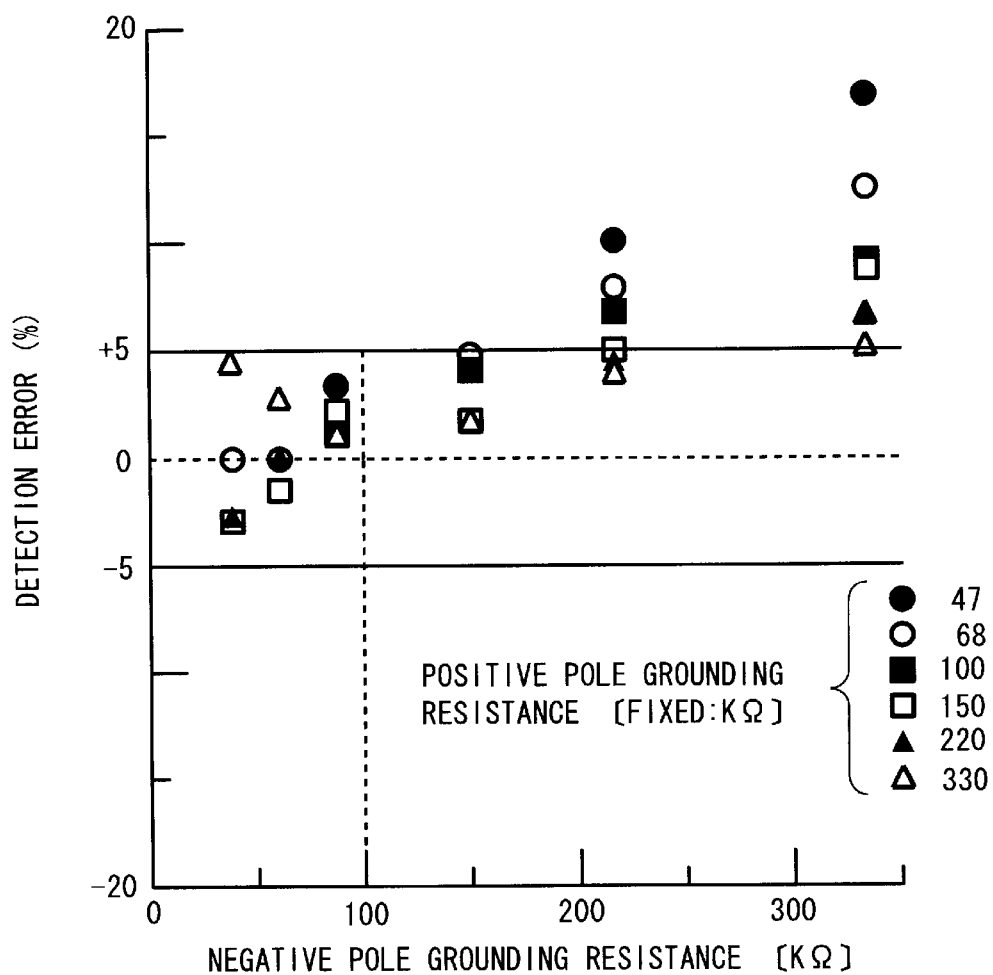
FIG. 12 is a diagram showing the result of a simulation test example of the simultaneous grounding of both positive and negative terminals.

FIG. 12 shows the results of the simulation test example where both of the positive and negative electrodes are grounded. The chart shows the result obtained with the circuit of the third embodiment when the grounding resistors on the positive side were respectively fixed to 47, 68, 100, 150, 220, and 330 KΩ whereas the grounding resistance of the negative electrode was changed. The ordinate indicates detection error (in %); the abscissa indicates the grounding resistance value. The chart shows that the error grows larger as the grounding resistance value increases. This is considered to be caused by that the change in the voltage of the capacitor tends to decrease in relation to the change in the grounding resistance as the grounding resistance increases; in other words, that in the area where the grounding resistance is high, a minute change in the capacitor voltage leads to a significant change in a detected grounding resistance value. In an area of 100 KΩ or less where the detection error presents a problem in practical use, the detection error is 5% or less, and the error over the whole measure ment range can be controlled to ±50 KΩ or less, exhibiting satisfactory results of detection. As easily understood from the above description, the present invention is designed so that, in order to detect the insulation of the positive and/or negative main circuits, which are connected respectively to the positive and negative terminals of the DC power source and are isolated from the ground potential section, it detects the capacitor terminal voltage or electric charge which is generated after the capacitor (and preferably, the current limiter) are connected in series between at least one of the positive and negative main circuits and the ground potential section for a predetermined time, and detects or calculates the insulation resistance between the positive and/or negative main circuits and the ground potential section on the basis of detected capacitor terminal voltage or electric charge and the power source voltage. Hence, as it is easily seen, specific circuit configurations and implementing methods of the present invention are available in various modifications.

Figure 13:
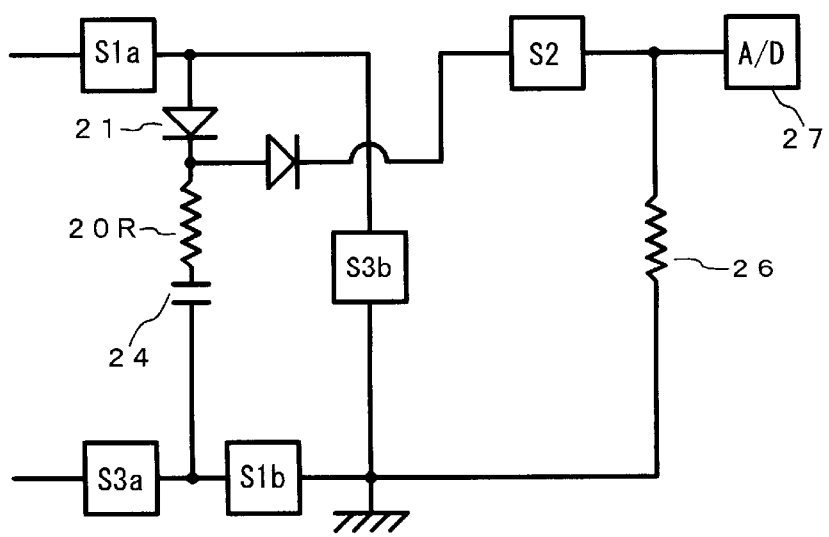
FIG. 13 is a block diagram of an essential circuit illustrating a partially modified example of the embodiment of FIG. 8.

FIG. 13 is the block diagram of the essential circuit illustrating a partially modified example of the embodiment of FIG. 8. Comparison with FIG. 8 reveals that the circuit shown in FIG. 13 requires fewer resistors. The operation of the modified example will be omitted since it will be easily understood from the description given to the embodiment of FIG. 8.

In the embodiments shown in FIGS. 8 and 13, it is apparent that the current limiting elements are not limited to the known fixed resistors; the use of known fixed inductors also enables the calculation of the grounding resistance values. The present invention may be further implemented in terms of the following various modifications:

(1) Capacitor potential dividers may be employed in place of the resistance type potential dividers r1 through r3 for detecting the line voltage.

(2) To detect the charging voltage of the capacitors 24 and 16C, the voltage of the capacitors is directly held and subjected to the analog-to-digital conversion rather than detecting the voltage across the discharging resistor.

(3) The current limiter, which is connected to the capacitor 24 in series, is connected at another appropriate location in the charging circuit of the capacitor 24, which is formed when the switch S1 or S3 is closed, rather than the positions shown in FIG. 1 and FIG. 5.

(4) In the embodiment of FIG. 5, the switches S4 through S6 are omitted and the voltage generated across the resistor 26 is subjected to full-wave rectification before it is supplied to the AD converter 27.

According to the present invention, with the positive and negative wirings kept ungrounded, the insulation between each of the wirings and the ground (vehicle body) can be accurately detected or calculated to enable accurate detection of grounding or an insulation failure even when it takes place in both positive and negative wirings or in an inverter as well as when it occurs only in either the positive or negative wiring.

What is claimed is:

1. A method for checking insulation of an ungrounded power source, wherein the insulation of one of positive and negative main circuit wirings, which are adapted to be respectively connected to positive and negative terminals of a DC power source and are isolated from a ground potential section, with respect to the ground potential section is checked, said method including of the steps of:

connecting a capacitor between the other of the main circuit wirings and said ground potential section for a predetermined time by closing a first switch and opening a second switch;

electrically isolating said other of the main circuit wirings from said capacitor by opening said first switch, then connecting said capacitor with a detecting device, for detecting the amount of electric charge accumulated in said capacitor, by closing said second switch; and determining the insulation resistance between said one of the main circuit wirings and said ground potential section in accordance with the detected amount of electric charge.

2. A method for checking the insulation of the ungrounded power source according to claim 1, wherein a charging current limiting element is also connected in series with the capacitor when the capacitor is connected between said one of the main circuit wirings and the ground potential section for a predetermined time.

3. A method for checking the insulation of the ungrounded power source according to claim 1, wherein the insulation resistance between said one of the main circuit wirings and the ground potential section is determined in accordance with the voltage of said main circuit wirings as well as the detected amount of electric charge.

4. An apparatus for checking insulation of an ungrounded power source, wherein the insulation of one of positive and negative main circuit wirings, which are adapted to be respectively connected to positive and negative terminals of a DC power source and are isolated from a ground potential section, with respect to the ground potential section is checked, said apparatus comprising:

first switch means for connecting a capacitor in series between the other one of the main circuit wirings and said ground potential section for a predetermined time so that the capacitor is to be electrically connected in series with an insulation resistance of said one of the main circuit wirings with respect to the ground potential section and a series circuit of the capacitor and the insulation resistance is connected between the positive and negative main circuit wirings;

second switch means for connecting a detecting device to the capacitor for detecting the amount of electric charge accumulated in said capacitor after said first switch means is opened to disconnect the capacitor from the other of the main circuit wiring; and determination means for determining the insulation between said one of the main circuit wirings and said ground potential section in accordance with the amount of the electric charge detected by said detecting device.

5. An apparatus for checking the insulation of the ungrounded power source according to claim 4, wherein said first switch means includes a positive first switch means for connecting the capacitor between the positive terminal of said main circuit wiring and the ground potential section and a negative first switch means for connecting the capacitor between the negative terminal of said main circuit wiring and the ground potential section;

said second switch means connects said capacitor to the detecting device in order to detect the amount of the first electric charge accumulated in the capacitor during the positive first switch means is closed and the amount of the second electric charge accumulated in the capacitor during the negative first switch means is closed after said positive first switch means and said negative first switch means are selectively closed for the predetermined time; and said determination means detects the capacitor terminal voltages which correspond to the detected amounts of said first and second electric charges and calculates the grounding resistance of at least one of the main circuit wirings with respect to the ground potential section in accordance with the terminal voltages.

6. An apparatus for checking the insulation of the ungrounded power source according to claim 4, further comprising switch control means which is connected to said first switch means and said second switch means, which the switch control means selectively closes said first switch means only for the predetermined time so as to charge said capacitor and open the second switch means while said first switch means is closed, and close said second switch means while the first switch means is open.

7. An apparatus for checking the insulation of the ungrounded power source according to claim 6, further comprising a current limiter inserted in series in a charging circuit of said capacitor which is formed when said first switch means is closed.

8. An apparatus for detecting the insulation of the ungrounded power source according to claim 6, further comprising a resistor which is connected between a terminal of said second switch means connected to the electric charge amount detecting device and the ground potential section.

9. An apparatus for checking the insulation of the ungrounded power source according to claim 5, further comprising a voltage detector circuit for detecting the line voltage between said positive and negative main circuit wirings and wherein determination means determines the insulation between at least the other main circuit wiring and the ground potential section in accordance with the detected amount of electric charge of said capacitor and the line voltage.

10. An apparatus for checking the insulation of the ungrounded power source according to claim 9, wherein the determination means is provided in advance with a table which shows the relationship between said electric charge amount, the voltage between the positive and negative main circuit wirings, and the insulation between said positive or negative main circuit wiring and the ground potential section.

11. An apparatus for checking the insulation of the ungrounded power source according to claim 6, wherein at least the first switch means is an insulated switch that comprises a switch section opening and closing a current path in which said switch means is inserted, and a controller section controlling the opening and closing of the switch section, and the switch section and the controller section are electrically isolated.

12. An apparatus for checking the insulation of the ungrounded power source according to claim 9, wherein the voltage detector circuit comprising of a voltage dividing circuit for dividing the voltage between said positive and negative main circuit wirings, a second capacitor connected to the divided voltage via a first pair of switch means, a second pair of switch means each having the one of their terminals connected respectively to opposite terminals of said second capacitor, a second resistor connected between the other of terminals of the second pair of switch means, and means for measuring the voltage across said second resistor; wherein said second pair of switch means is controlled so that they are opened while the first pair of switch means are closed, whereas they are closed while said first pair of switch means are opened.

13. An apparatus for checking the insulation of the ungrounded power source according to claim 12, wherein at least the first pair of switch means are insulated switches.

14. An apparatus for checking insulation of an ungrounded power source, wherein the insulation of one positive and negative main circuit wirings, which are adapted to be respectively connected to positive and negative terminals of a DC power source and are isolated from a ground potential section, with respect to the ground potential section is checked, said apparatus comprising:

a first switching element connected in series between the other of the main circuit wirings and one terminal of a capacitor;

a second switching element having one terminal connected to a junction point of the first switching element and the capacitor;

a resistor having one terminal connected to the other terminal of said second switching element; and a control circuit for detecting a voltage which is generated across said resistor due to the discharging current of said capacitor when the second switching element is closed after said first switching element was closed for a predetermined time so that the capacitor is to be electrically connected in series with an insulation resistance of said one of the main circuit wirings with respect to the ground potential section and a series circuit of the capacitor and the insulation resistance is connected between the positive and negative main circuit wirings.

15. An apparatus for checking the insulation of the ungrounded power source according to claim 14, further comprising a third switching element connected in series between the other of said main circuit wirings and one terminal of said capacitor; wherein said control circuit further detects another voltage which is generated across said resistor when the second switch element is closed after said third switching element was closed for a predetermined time.

16. An apparatus for checking the insulation of the ungrounded power source according to claim 14, further comprising:

a fourth switching element connected between the other terminal of said capacitor and the ground potential section;

a fifth switching element connected between the other terminal of said capacitor and the other terminal of said second switching element; and a sixth switching element connected between the one terminal of said capacitor and the ground potential section.

17. An apparatus for checking the insulation of the ungrounded power source according to claim 15, further comprising a current limiter inserted in series in the charging circuit of said capacitor which is formed when one of said first and third switches is closed.

18. An apparatus for checking the insulation of the ungrounded power source according to claim 17, wherein said resistor serving as the current limiter is inserted between the ground and the junction point of said first switching element and said capacitor.

19. An apparatus for checking the insulation of the ungrounded power source according to claim 4, wherein said ground potential section is a vehicle body of an electric vehicle and said positive and negative main circuit wirings are the feeder lines to a motor for propelling and driving the vehicle; and a breaker is further provided to cut off the power supply from a battery when said determination means detects a fault in the insulation.

20. An apparatus for checking the insulation of the ungrounded power source according to claim 14, wherein said ground potential section is a vehicle body of an electric vehicle and said positive and negative main circuit wirings are the feeder lines to a motor for propelling and driving the vehicle; and a breaker is further provided to cut off the power supply from a battery when said control circuit detects a fault in the insulation.

21. A method for checking insulation of an ungrounded power source, wherein the insulation of one of positive and negative main circuit wirings, which are adapted to be respectively connected to positive and negative terminals of a DC power source and are isolated from a ground potential section, with respect to the ground potential section is checked, said method comprising of the steps of:

connecting a capacitor between the other of the main circuit wirings and said ground potential section for a predetermined time so that the capacitor is to be charged with a current through an insulation resistance of said one of the main circuit wirings with respect to the ground potential section;

electrically isolating the other of the main circuit wirings from said capacitor, then connecting a detecting device to said capacitor, for detecting the amount of electric charge accumulated in said capacitor; and determining the insulation resistance between said one of the main circuit wirings and said ground potential section in accordance with the detected amount of electric charge.

* * * * *